United States Patent
Fragano et al.

(10) Patent No.: US 6,442,085 B1
(45) Date of Patent: Aug. 27, 2002

(54) SELF-TEST PATTERN TO DETECT STUCK OPEN FAULTS

(75) Inventors: Michael Thomas Fragano, Essex Junction; Jeffery Howard Oppold, Richmond; Michael Richard Ouellette, Westford; Jeremy Paul Rowland, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/677,681

(22) Filed: Oct. 2, 2000

(51) Int. Cl.$^7$ .............................. G11C 7/00; G11C 8/00
(52) U.S. Cl. .............. 365/201; 365/189.08; 365/230.06
(58) Field of Search ........................... 365/201, 189.08, 365/230.06, 200

(56) References Cited

U.S. PATENT DOCUMENTS

| | | | |
|---|---|---|---|
| 4,742,293 A | 5/1988 | Koo et al. .................. 714/726 |
| 5,361,232 A | 11/1994 | Petschauer et al. ......... 365/201 |
| 5,554,941 A | 9/1996 | Kesel ........................ 324/765 |
| 5,675,545 A | 10/1997 | Madhavan et al. ......... 365/201 |
| 5,689,466 A | 11/1997 | Qureshi ..................... 365/201 |
| 5,872,018 A | 2/1999 | Lee ............................. 438/18 |
| 6,067,262 A | * 5/2000 | Irrinki et al. ............... 365/201 |
| 6,163,862 A | * 12/2000 | Adams et al. .............. 365/201 |
| 6,246,617 B1 | * 6/2001 | Urakawa .................... 365/201 |

OTHER PUBLICATIONS

Truong K., Testing Strategy For CMOS Open Fault, IBM Technical Disclosure Bulletin, vol. 3 No. 2, Jul. 1990, pp. 356–363.

* cited by examiner

Primary Examiner—Trong Phan
(74) Attorney, Agent, or Firm—Connolly, Bove Lodge & Hutz, LLP

(57) ABSTRACT

A testing method and device for detecting the existence of "stuck-open", faults within static decoder circuits of a SRAM. The device and method make use of a novel pattern that fully tests static decoders used with an SRAM integrated circuit. The test pattern is selected so as to cause a transition on each parallel FET in a decoder circuit. The test pattern simulates multiple random accesses to the SRAM by modifying the traditional sequential, unique address pattern. The invention uses a two-dimensional pattern in that it separately tests rows and column decoders. In the first part of the test the input address to the column decoders is held constant while the row decoders are cycled through two sets of N iterations where N is the number of row address bits to be decoded. During the second part of the test the input address to the row decoders is held constant while the column decoders are cycled through two sets of M iterations where M is the number of column address bits to be decoded.

15 Claims, 10 Drawing Sheets

FIG. 2
PRIOR ART

| CYCLE | A2 | A1 | A0 | Z |
|-------|----|----|----|----|
| 1 | 0 | 0 | 0 | 1 |
| 2 | 0 | 0 | 1 | 1 |
| 3 | 0 | 1 | 0 | 1 |
| 4 | 0 | 1 | 1 | 1 |
| 5 | 1 | 0 | 0 | 1 |
| 6 | 1 | 0 | 1 | 1 |
| 7 | 1 | 1 | 0 | 1 |
| 8 | 1 | 1 | 1 | 0 |
| 9 | 0 | 0 | 0 | 1 |

FIG. 3
PRIOR ART

| CYCLE | A2 | A1 | A0 | Z |
|-------|----|----|----|----|
| 1 | 1 | 1 | 1 | 0 |
| 2 | 1 | 1 | 0 | 1 |
| 3 | 1 | 0 | 1 | 1 |
| 4 | 1 | 0 | 0 | 1 |
| 5 | 0 | 1 | 1 | 1 |
| 6 | 0 | 1 | 0 | 1 |
| 7 | 0 | 0 | 1 | 1 |
| 8 | 0 | 0 | 1 | 1 |
| 9 | 1 | 1 | 1 | 0 |

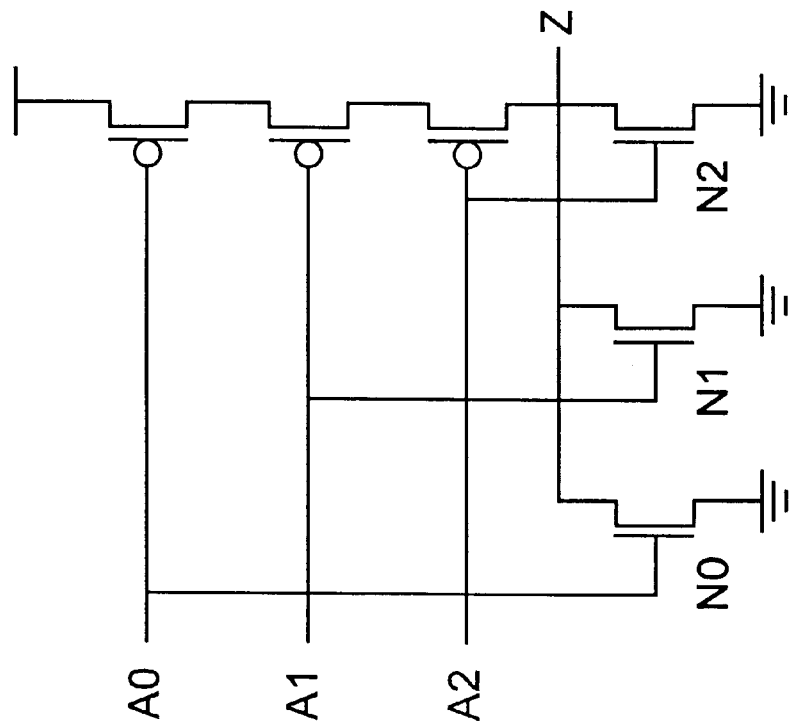
FIG. 4b *PRIOR ART*
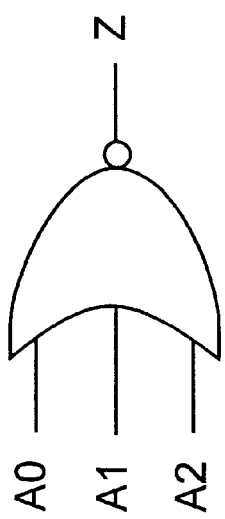
FIG. 4a *PRIOR ART*

FIG. 5
PRIOR ART

| CYCLE | A2 | A1 | A0 | Z |
|---|---|---|---|---|
| 1 | 0 | 0 | 0 | 1 |
| 2 | 0 | 0 | 1 | 0 |
| 3 | 0 | 1 | 0 | 0 |
| 4 | 0 | 1 | 1 | 0 |
| 5 | 1 | 0 | 0 | 0 |
| 6 | 1 | 0 | 1 | 0 |
| 7 | 1 | 1 | 0 | 0 |
| 8 | 1 | 1 | 1 | 0 |
| 9 | 0 | 0 | 0 | 1 |

FIG. 6
PRIOR ART

| CYCLE | A2 | A1 | A0 | Z |
|---|---|---|---|---|
| 1 | 1 | 1 | 1 | 0 |
| 2 | 1 | 1 | 0 | 0 |
| 3 | 1 | 0 | 1 | 0 |
| 4 | 1 | 0 | 0 | 0 |
| 5 | 0 | 1 | 1 | 0 |
| 6 | 0 | 1 | 0 | 0 |
| 7 | 0 | 0 | 1 | 0 |
| 8 | 0 | 0 | 0 | 1 |
| 9 | 1 | 1 | 1 | 0 |

| A2 | A1 | A0 |
|----|----|----|
| 1  | 1  | 1  |
| 1  | 1  | 0  |
| 1  | 1  | 1  |
| 1  | 0  | 1  |
| 1  | 1  | 1  |
| 0  | 1  | 1  |
| 1  | 1  | 1  |

FIG. 9
PRIOR ART

| A2 | A1 | A0 |
|----|----|----|
| 0  | 0  | 0  |
| 0  | 0  | 1  |
| 0  | 0  | 0  |
| 0  | 1  | 0  |
| 0  | 0  | 0  |
| 1  | 0  | 0  |
| 0  | 0  | 0  |

2:1 MUXES

2:1 MUXES

FIG. 11

| | | |
|---|---|---|
| WRITE 1 | INCREMENT | 1025 |
| READ 1/WRITE 0/READ 0 (NO SWAP) | INCREMENT | 3073 |
| READ 0/WRITE 1/READ 1 (SWAP A0 WITH A1) | INCREMENT | 3073 |
| READ 1/WRITE 0/READ 0 (SWAP A0 WITH A2) | INCREMENT | 3073 |
| READ 0/WRITE 1/READ 1 (SWAP A0 WITH A3) | INCREMENT | 3073 |
| READ 1/WRITE 0/READ 0 (SWAP A0 WITH A4) | INCREMENT | 3073 |
| READ 0/WRITE 1/READ 1 (SWAP A0 WITH A5) | INCREMENT | 3073 |
| READ 1/WRITE 0/READ 0 (SWAP A0 WITH A6) | INCREMENT | 3073 |
| READ 0/WRITE 1/READ 1 (SWAP A0 WITH A7) | INCREMENT | 3073 |
| READ 1/WRITE 0/READ 0 (SWAP A0 WITH A8) | INCREMENT | 3073 |
| READ 0/WRITE 1/READ 1 (SWAP A0 WITH A9) | INCREMENT | 3073 |
| WRITE 1 | DECREMENT | 1025 |
| READ 1/WRITE 0/READ 0 (NO SWAP) | DECREMENT | 3073 |
| READ 0/WRITE 1/READ 1 (SWAP A0 WITH A1) | DECREMENT | 3073 |
| READ 1/WRITE 0/READ 0 (SWAP A0 WITH A2) | DECREMENT | 3073 |
| READ 0/WRITE 1/READ 1 (SWAP A0 WITH A3) | DECREMENT | 3073 |
| READ 1/WRITE 0/READ 0 (SWAP A0 WITH A4) | DECREMENT | 3073 |
| READ 0/WRITE 1/READ 1 (SWAP A0 WITH A5) | DECREMENT | 3073 |
| READ 1/WRITE 0/READ 0 (SWAP A0 WITH A6) | DECREMENT | 3073 |
| READ 0/WRITE 1/READ 1 (SWAP A0 WITH A7) | DECREMENT | 3073 |
| READ 1/WRITE 0/READ 0 (SWAP A0 WITH A8) | DECREMENT | 3073 |
| READ 0/WRITE 1/READ 1 (SWAP A0 WITH A9) | DECREMENT | 3073 |

FIG. 12

| | | |
|---|---|---|
| WRITE 1 | INCREMENT | 33 |
| READ 1/WRITE 0/READ 0 (NO SWAP) | INCREMENT | 97 |
| READ 0/WRITE 1/READ 1 (SWAP A10 WITH A1) | INCREMENT | 97 |
| READ 1/WRITE 0/READ 0 (SWAP A10 WITH A2) | INCREMENT | 97 |
| READ 0/WRITE 1/READ 1 (SWAP A10 WITH A3) | INCREMENT | 97 |
| READ 1/WRITE 0/READ 0 (SWAP A10 WITH A4) | INCREMENT | 97 |
| WRITE 1 | DECREMENT | 33 |
| READ 1/WRITE 0/READ 0 (NO SWAP) | DECREMENT | 97 |
| READ 0/WRITE 1/READ 1 (SWAP A10 WITH A11) | DECREMENT | 97 |
| READ 1/WRITE 0/READ 0 (SWAP A10 WITH A12) | DECREMENT | 97 |
| READ 0/WRITE 1/READ 1 (SWAP A10 WITH A13) | DECREMENT | 97 |
| READ 1/WRITE 0/READ 0 (SWAP A10 WITH A14) | DECREMENT | 97 | ns
SELF-TEST PATTERN TO DETECT STUCK OPEN FAULTS

FIELD OF THE INVENTION

The present invention relates to the testing of integrated circuits and, in particular, to a logic pattern implemented by a Built-In Self-Test (BIST) that fully tests static decoders (decoders comprised of static CMOS logic elements) in a compilable static random-access memory (SRAM) architecture.

BACKGROUND OF THE INVENTION

Existing "unique address" BIST logic patterns test the SRAM by accessing each memory cell in a sequential incrementing address or decrementing address pattern. These patterns are used because they are exhaustive in that they access every cell address in the design as well as being very easily implemented in an on-chip BIST circuit. For each cell access, a logic value is read, then the opposite logic value is written and read. Unfortunately, these patterns do not fully test the static address decoder logic inside the SRAM, as will become clear from the following.

A simple prior art three-bit static decoder, implemented as a three-input NAND (FIG. 1a) decoder in complementary MOS (CMOS) logic, is shown in FIG. 1b. Output Z of FIG. 1b is a logical "0" when inputs A0, A1, and A2 are all at a logical "1". The output Z is a logic 1 value for all other combinations of the inputs. A traditional sequential addressing pattern, for the decoder of FIG. 1b, is shown in FIG. 2, where A0 is the least significant bit (LSB). As shown in the incrementing address sequence of FIG. 2, the only transitions that cause the output Z to change logical state are from cycle 7 to 8, (A), and from cycle 8 to 9, (B). All of the n-channel field effect transistors (NFETs) must be functional to cause Z to transition to a logical "0". However, for the output Z to transition from a logical 0 to a logical 1, only one functional p-channel FET (PFET) is needed, as shown by transition (B). Either of the other two remaining PFETs could be "stuck open" and this test pattern would not detect them. The reason the "stuck open" fault would not be detected is described by example in the following paragraph.

Suppose PFET P2, as shown in FIG. 1a, is defective due to a "stuck open" fault and PFETS P0 and P1 function properly. During cycle 4, listed in the table of FIG. 2, the logic values assigned to bits A0–A2 will cause PFETS P0 and P1 to stop conducting current between their respective drain and source leads. In other words, P0 and P1 will become open circuited. PFET P2 is intended to conduct current, thereby allowing the higher potential rail voltage, less the small drain-to-source voltage drop, to develop on the output Z. However, because P2 has a "stuck-open" fault, the PFET does not conduct current between its drain and source and, therefore, cannot support the development of a voltage potential at output Z. This situation does not necessarily cause the output Z to transition to a logical 0 state, though. During cycle 3, output Z has a voltage potential representing a logical 1 and this potential will charge the parasitic capacitances of the FETs. The parasitic resistances of the FETs will not discharge the stored energy quickly enough to cause the output Z to reflect a logical 0, in some instances. In such an instance, only a conductive path between output Z and the lower potential rail voltage could discharge the stored energy sufficiently quickly to generate a logical 0 on output Z. During cycle 4, however, the NFET connected to A2, and in series with the two other NFETs, prevents the flow of current between the output Z and the lower potential rail. Therefore, the "stuck open" fault affecting P2 would not be detected by the test sequence shown in the table of FIG. 2. Similarly, a "stuck open" fault affecting any other PFET or any two PFETs may not be detected by the test sequence.

Again, for the three-input NAND gate, the decrementing address sequence of FIG. 3 shows that the output Z changes its logical state only during the transition from cycle 1 to cycle 2, (A), and from cycle 8 to cycle 9, (B). Transition (B) will fully test the NFETs, since all 3 NFETs are required to be functional for the output Z to change to a logical "0." Transition (A) requires only one PFET (specifically device P0) to be functional for the output Z to change to a logical "1" state. Devices P1 and P2 could have "stuck open" faults and this test sequence would not detect them, for the same reason described in the preceding paragraph.

This problem also exists for a NOR decoder. A three bit NOR decoder is shown in FIGS. 4a and 4b. The output Z is a logic 1 value when inputs A0, A1, and A2 are all at logic 0 values. The output Z is a logic 0 value for all other combinations of the inputs. An ascending sequential addressing pattern is shown in FIG. 5, where A0 is the least significant bit (LSB). As shown in FIG. 5, the only transitions that cause the output Z to change logic states are from cycle 1 to 2, (A), and from cycle 8 to 9, (B). All three PFETs must be functional to transition the output Z from 0 to 1. In transition (A), the only NFET being tested is N0. A "stuck-open" fault in N1 or N2 will go undetected by this test. Again, for the descending pattern, only one NFET must be functional and either of the other two may have "stuck-open" faults, which would go undetected, as shown in FIG. 6. The reason these "stuck open" faults would not be detected is explained by example in the following paragraph.

Suppose NFET N2, as shown in FIG. 4a, is defective due to a "stuck open" fault and NFETS N0 and N1 function properly. During cycle 5, listed in the table of FIG. 5, the logic values assigned to bits A0–A2 will cause NFETS N0 and N1 to stop conducting current between their respective drain and source leads. In other words, N0 and N1 will become open circuited. NFET N2 is intended to conduct current, thereby allowing output Z to develop the voltage of the lower potential rail, plus the small drain-to-source voltage drop. However, because N2 has a "stuck-open" fault, the NFET does not conduct current between its drain and source and, therefore, cannot discharge the energy stored by the parasitic capacitances of the FETs quickly enough in some instances. This situation does not necessarily cause the output Z to transition to a logical 1 state, though. During cycle 4, output Z has a voltage potential representing a logical 0 and this potential determines the charge stored by the parasitic capacitances of the FETs attached to output Z. The PFETs connected to A0 and A1, and in series with PFET A2, prevent the flow of current between the output Z and the higher potential rail. As a result, the output Z will tend to maintain the logical 0 state since no conductive path exists to the higher potential rail. Therefore, the "stuck open" fault affecting N2 would not be detected by the test sequence shown in the table of FIG. 5.

The sequential addressing patterns (both the increment and decrement) do not test devices P1 and P2 in the NAND and devices N1 and N2 in the NOR. The traditional unique address pattern used during a self-test operation is sequential. However, during normal functional operation the SRAM is accessed randomly. It was shown above that the SRAM would pass a sequential pattern, generated by an on-chip BIST, even when certain decoder devices are failing. However, these failures may be exhibited in normal operation, resulting in non-functional customer hardware. Therefore, it is imperative that these "stuck-open" faults be detected during a manufacturing test.

Application specific integrated circuit (ASIC) products create a number of very unique concerns. The nature of ASIC products is such that unique circuit designs may be readily developed during the market-life of an ASIC technology library, with each design different from the rest and developed for a highly specific use. Also, the SRAMs, which appear in these ASIC chips, may be configured to the customers' size and area needs. Because of the large number of chip designs involved, the entire design-for-testability (DFT) flow is automated, with minimal manual intervention. Because each ASIC technology library contains several different SRAM architectures, a single test pattern is required that is generic enough to test various CMOS static decoder implementations, which may exist in these various SRAM architectures.

Also, a particular ASIC test methodology may use an on-chip MABIST (Multiple Array Built-In Self-Test) controller to self-test the SRAMs. The MABIST controller can be implemented as a state machine capable of producing a number of test controls and a set of test vectors that access the SRAMS.

SUMMARY OF THE INVENTION

The invention is drawn to a method and an apparatus that make use of the decoder addressing logic pattern, shown in FIGS. 7a–7c, to simulate multiple random accesses to an SRAM in order to solve the testability problems described above. Applying the logic pattern to the input lines of a static decoder allows every FET in the static decoder to be individually responsible for causing a state change at the decoder output. In this way, every FET within a set of SRAM address decoders may be tested for "stuck-open" faults. Both NAND and NOR logic functions, as shown above, typically appear in SRAM static address decoder circuits. By using static address decoders in SRAMs instead of dynamic decoders, the power consumption and switching-generated noise of the SRAM can be minimized. In the past, SRAM designs have frequently implemented static decoders despite this testability concern. The test pattern described herein will be able to detect all "stuck-open" faults in future SRAM circuits designs implementing CMOS static address decoders and prevent the faults from first being detected in the environment of the customer's application.

BRIEF DESCRIPTION OF THE DRAWINGS

The above and other objects, features, and advantages of the present invention will become more apparent from the following detailed description that is to be read in conjunction with the accompanying drawings, in which:

FIG. 2 tabulates a prior art ascending test pattern for the circuit of FIG. 1b;

FIG. 3 tabulates a prior art descending test pattern for the circuit of FIG. 1b;

FIG. 4a illustrates a prior art three-input NOR gate symbol;

FIG. 4b illustrates a prior art three-input NOR gate circuit;

FIG. 5 tabulates a prior art ascending test pattern for the circuit of FIG. 4b;

FIG. 6 tabulates a prior art descending test pattern for the circuit of FIG. 4b;

FIG. 7a tabulates test patterns, iterations 1;

FIG. 7b tabulates test patterns, iterations 2;

FIG. 7c tabulates test patterns, iterations 3;

FIG. 8 illustrates an ideal 3-bit NAND decoder test address sequence;

FIG. 9 illustrates an ideal 3-bit NOR decoder test address sequence;

FIG. 11 tabulates a ripple word pattern set; and

FIG. 12 tabulates a ripple bit pattern set.

DETAILED DESCRIPTION OF THE INVENTION

Figure 1B:
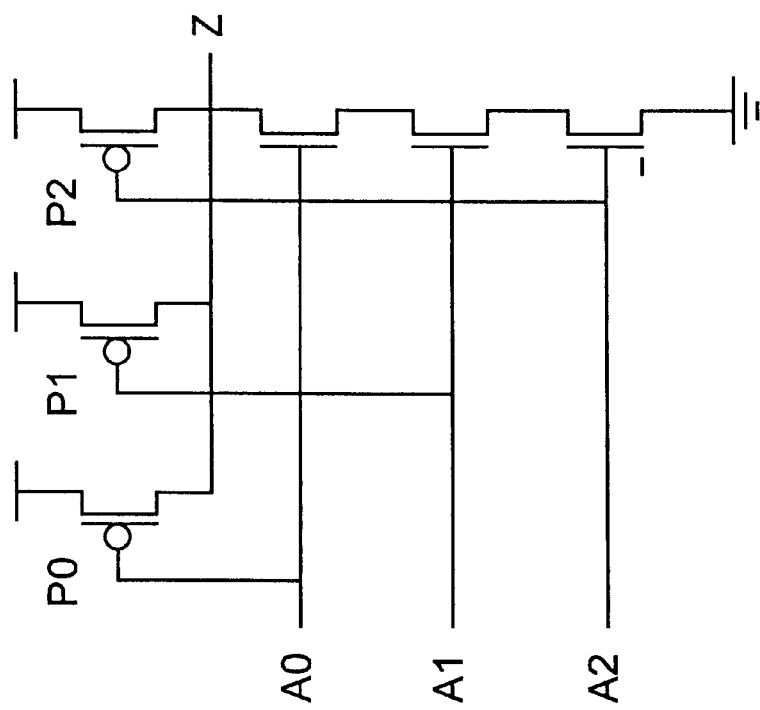
FIG. 1b illustrates a prior art three-input NAND gate circuit.
Figure 1A:
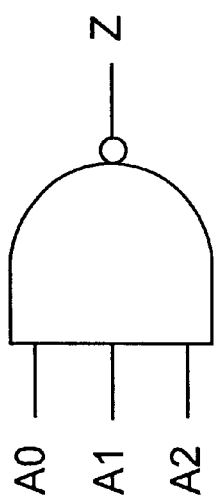
FIG. 1a illustrates a prior art three-input NAND gate symbol.

Ideally, a pattern is needed which causes a transition on each parallel FET in the decoder circuit once and only once. Such a pattern will minimize the number of pattern cycles needed to test the decoders and will, thereby, minimize the testing time and cost. A three-bit pattern, which implements this desired pattern sequence, is shown in FIGS. 8 and 9. These patterns test all six FET devices in any 3-input static decoder, with no wasted cycles. The problem with this pattern, though, is that it is difficult to observe in an SRAM, since the decoder outputs are not directly accessible. The outputs of the row and column decoders are not directly observable and therefore can only be tested by writing and reading the SRAM array cells and observing the data outputs of the SRAM after the read operation. The "ideal" pattern for testing a NAND decoder, tabulated in FIG. 8, toggles back and forth between an address where all of the address bits are set to logical "1s" and a set of other addresses differing only by a single bit. The set of other addresses contains each possible address where one and only one of the address bits is set to a logical "0." The "ideal" pattern for testing a NOR decoder, tabulated in FIG. 9, toggles back and forth between an address where all of the address bits are set to logical "0s" and a set of other addresses differing by a single bit. The set of other addresses contains each possible address where one and only one of the address bits is set to a logical "1."

In each of the tables of FIGS. 8 and 9, some potential 3-bit inputs are not listed and one is listed repeatedly. Uniquely, addressing each element exactly once in the array and performing a series of read and write operations on the element is an important and necessary aspect of verifying the proper functionality of the decoder FETs. For example, suppose all but one of the FETs of an address decoder circuit function properly and that this one inoperable FET causes the address decoder to incorrectly select address Y when address X is intended. Let Y be greater than X, for this example. Suppose, again, that all of the memory array elements are pre-loaded with a logical "1" bit value. The value stored at address X is unimportant for this example. Further suppose that each address is sequentially accessed, from the lowest to highest address, and a set of read, write, and read operations is performed on each sequentially addressed memory element. Let the read, write, and read operation for this example consist of reading the valued stored in memory, writing a logical "0" to the memory element, and reading the content of the memory element, again. The read operation is performed to verify that the data value intended to be stored in the memory element, during a previous write operation, was in fact stored there. When the incremental addressing sequence reaches the point where the address decoders are supposed to decode address X but errantly decode address Y, the set of read, write, and read operations are unintentionally performed at address Y. Thereafter, the memory element at address Y will have a logical "0" stored in it. Later, in the incremental addressing sequence, the decoders are intended to decode address Y and the read, write, and read operations are intentionally performed at this address. However, the initial read operation will detect a logical "0' stored in the memory element when a logical "1" value is expected. A decoding fault of this type can be detected by using a sequential addressing scheme that uniquely addresses every element of a memory array, but not with the "ideal" pattern previously described. Such a pattern should cause each FET in the decoder to be singularly responsible for changing the output of the decoder when progressively sweeping through the entire address set of the SRAM array. The present invention is a pattern of this form and is described in greater detail in the following paragraphs.

Because the purpose of the test pattern is to detect faults only in the decoders, not in the memory array, the address bits for the set of decoders not immediately being tested can be held constant. For example, the row and column decoders can be tested in separate steps. This significantly reduces the time and cost required to test for "stuck-open" faults in static CMOS decoder circuits.

The invention provides a test pattern that simulates multiple random accesses to the SRAM by modifying the traditional sequential, unique address pattern. In the preferred embodiment, the pattern is two-dimensional in that it separately tests row and column address decoders. For the first part of the test, the input address to the column decoders is held constant, while the row decoders are cycled through two sets of N iterations. N is the number of row address bits to be decoded. During the second part of the test, the input address to the row decoders is held constant, while the column decoders are cycled through two sets of M iterations. M is the number of column address bits to be decoded.

For each iteration, I, of the first set of N iterations, the address value is incremented through the full range of $2^N$ values. Similarly, for each iteration, 1, of the column decoder test, the address is incremented through the full range of 2Mvalues. At each address value in iteration I, a read operation is performed, followed by a write operation, followed by a read operation. When iteration I is an odd numbered iteration, the test performs a read, write, and read (RWR) sequence of "true/complement/complement" data. When iteration I is an even numbered iteration, the test performs a RWR sequence of "complement/true/true" data. A "true" value may take the form of either a logical "1" or a logical "0." The complement to the "true" value will be the opposite logical value.

The sequence of addressing, for the first iteration within the first set of N or M iterations, is an incrementally increasing sequence from the lowest address value to the highest. The sequence of addressing will progress in the same manner during the second iteration of the first set of N or M iterations, with the exception that the logic values of address bits A0 and A1, generated by the address generation circuit, will be swapped by an intermediary bit-swapping device. This intermediary bit-swapping device is interconnected with the address output lines of the address generation circuit and the address input lines of the SRAM device. During iteration I of the first set of N or M iterations, for I greater than 2, the sequence of addressing will be the same as that described for the second iteration, except that the $I^{th}-1$ address bit will be swapped with address bit A0, (e.g., during iteration 3, address bit A2 will be swapped, by the intermediary bit-swapping device, with that of A0). This first set of N iterations verifies the operational performance of the FETs comprising the NOR circuits in the address decoders.

After the first set of N iterations is complete, the row decoders are then cycled through a second set of N iterations. During this second set of N iterations, the test sequence, described above, is performed again with the exception that the sequence of $2^N$ addresses is generated in the reverse order for each iteration I. This second set of N iterations verifies the operational performance of the FETs comprising the NAND circuits in the address decoders.

When the row decoder test sequence is complete, the column address decoders are tested in the same manner described for testing the row decoders. In this case, though, the address is incremented through the full range of $2^M$ values, for each iteration I, of the first set of M iterations. Thereafter, the address sequence is generated in the reverse order through the full range of $2^M$ values, for each iteration I, of the second set of M iterations.

Figures 7A, 7B, 7C:
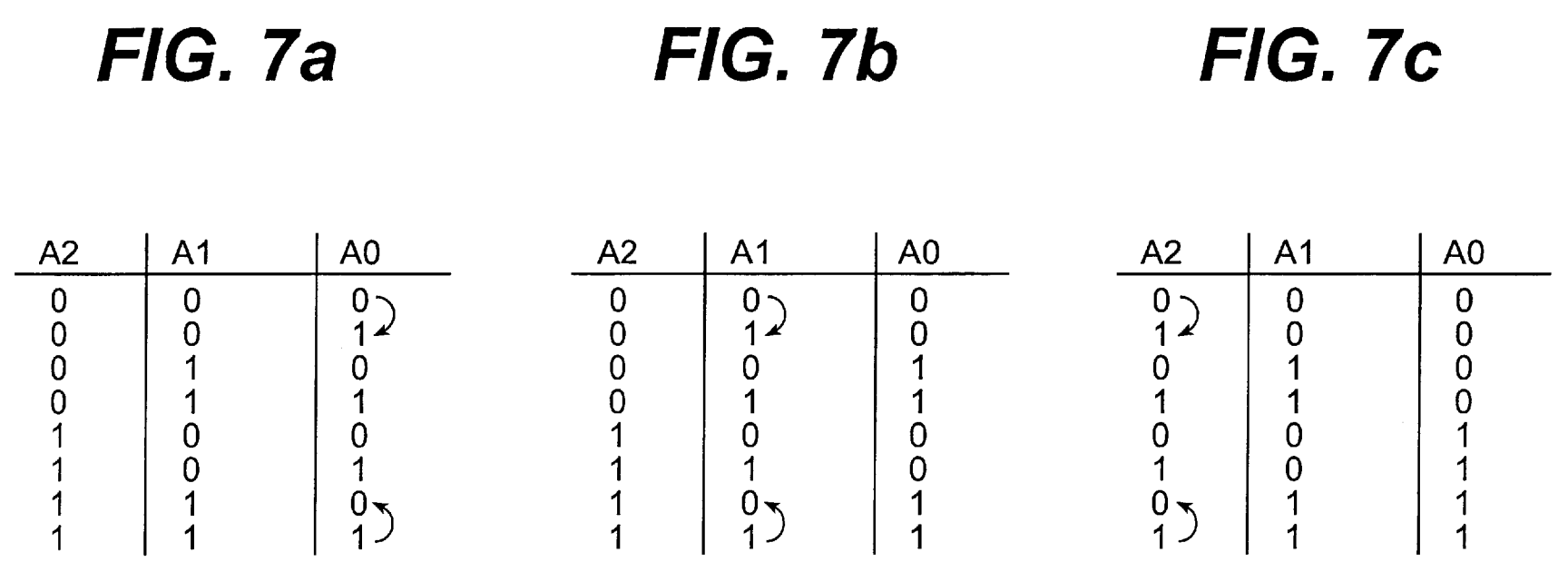

FIGS. 7a, 7b, and 7c tabulate an example of the test pattern that completely tests a generic 3-bit decoder. FIG. 7a tabulates the addressing sequence generated by the address generation circuitry and provided to the address input lines of the SRAM device, during the first iteration. The addressing sequence begins with the address listed in the first row of the table, progresses down through each subsequent row, and finishes with the address listed in the last row of the table. This address sequence can be written in the form {000, 001, 010, 011, 100, 101, 110, 111}, where the bits are listed in the order of A2, A1, and A0. During the second iteration of the test sequence, the address generation circuit generates the same sequence of addresses tabulated in FIG. 7a. However, the intermediary bit-swapping device swaps the bit values of address bits A0 and A1, appearing on the output lines of the address generation logic, before the bit values are applied to the input address lines of the SRAM device. The sequence of address bits appearing at the input to the SRAM device is tabulated in FIG. 7b. The third iteration of the test sequence is similar to the second iteration. Again, the address generation circuit generates the same sequence of addresses tabulated in FIG. 7a. In this iteration, the intermediary bit-swapping device swaps the bit values of address bits A0 and A2 before the bit values are applied to the input address lines of the SRAM device. The sequence of address bits appearing at the input to the SRAM device is tabulated in FIG. 7c. To complete the test, a second set of 3 iterative sequences through the entire range of addresses is executed. This time, the set of addresses is sequenced in the reverse order from that used in the first set of 3 iterations.

Figure 10A:
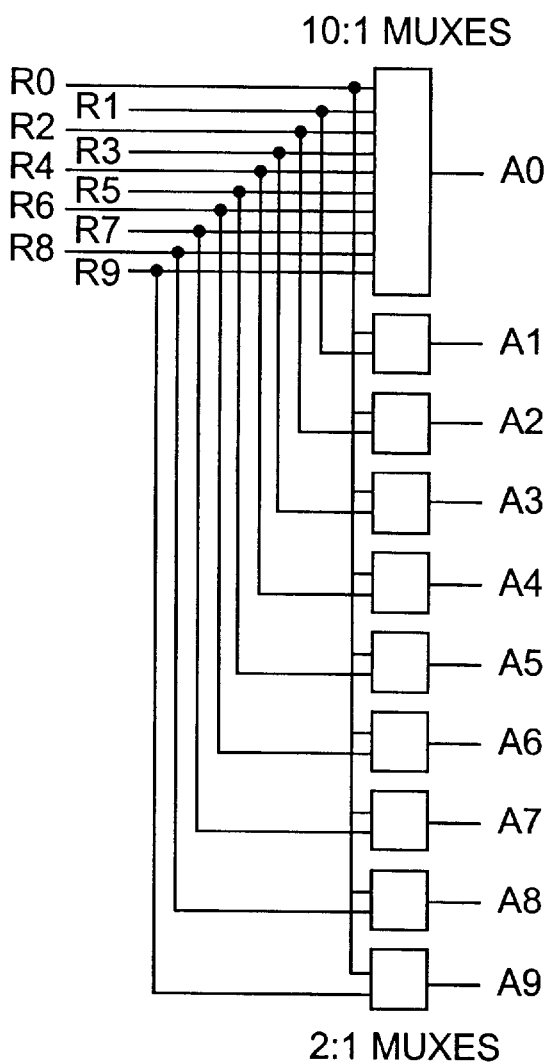
FIG. 10a illustrates a 10-bit row address multiplexer.
Figure 10B:
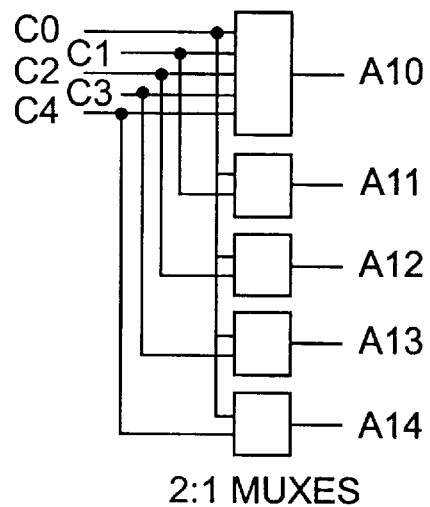
FIG. 10b illustrates a 5-bit column address multiplexer.

An exemplary implementation of the test pattern for a 15-bit address field is described below. The intermediary bit-swapping device is implemented as a bank of multiplexers situated between the address generation circuit and the MABIST controller's output address bus, which is connected to the input address lines of the SRAM. The 15-bit address field generated by the address generation circuit is separated into a 10-bit row address, R0–R9, as shown in FIG. 10a, and a 5-bit column address, C0–C4, as shown in FIG. 10b. The generated row bits R0–R9 and column bits C0–C4 are provided to the input lines of multiplexer units, as shown in FIGS. 10a and 10b. FIG. 10a illustrates nine two-line to one-line (2:1) multiplexers and one ten-line to one-line (10:1) multiplexer. FIG. 10b illustrates four 2:1 and one 5:1 multiplexers. Lines A0–A14, in FIGS. 10a and 10b, are the address lines connected to the input address lines of the SRAM. Not shown in FIGS. 10a and 10b are the select line inputs to each multiplexer that cause it to connect a particular input line to the output line. However, this feature need not be shown since it is well understood by a person of ordinary skill in the art.

The least-significant bit of the input row address, R0, is connected to an input of every multiplexer unit in FIG. 10a and all of the input row address bits are connected to the 10:1 10 multiplexer. The input row address bits R1–R9 are each connected one and only one of the nine 2:1 multiplexers. With this configuration, the value appearing on bit line R0 can be interchanged with the bit value appearing on any other bit line of the set R1–R9 before the address information is provided to the input address lines of the SRAM. For example, if all of the 2:1 multiplexers of FIG. 10a are configured to connect their lower-most input line, shown on each multiplexer unit, to their output line and the 10:1 multiplexer is configured to connect its upper-most input line to its output line, then the address values of bit lines R0–R9 would appear on the output lines A0–A9, respectively. On the other hand, if the 10:1 multiplexer is configured to connect its lowermost input line to its output line and the multiplexer connected to the output line labeled A9 is configured to connect its upper-most input line to its output line, then the bit value of R0 will appear on bit line A9 and the bit value of R9 will appear on bit line A0. The bit-swapping device illustrated by FIG. 10b operates in an analogous way for the column address bits.

An iteration counter provides a signal to the select lines of each multiplexer to control and synchronize the bit-swapping functionality of the multiplexers. This iteration counter and the intermediary bit-swapping circuit support the optimal integration of the test pattern into the existing MABIST. This integration is accomplished with a minimum of additional circuit-area overhead and complexity, by re-using several existing subcircuits.

An example test pattern set for the ASIC MABIST controller of FIGS. 10a and 10b is shown in FIGS. 11 and 12. Column 1 of each figure identifies the operation performed during iteration I. Column 2 identifies which of the two sets of N or M iterations is being executed. The first set is being executed if the value in column 2 is "increment" and the second set is being executed if the value in column 2 is "decrement." The third column of each figure lists the number of counter cycles required to perform the identified read, write, and reset operations during the iteration. In the following paragraphs, a description of how the test pattern might be applied to an SRAM device having an integrated ASIC MABIST, of the form shown in FIGS. 10a and 10b, is provided.

For the first part of the test, the input address to the column decoders is held constant, while the row decoders are cycled through two sets of N iterations. N is the number of row address bits to be decoded. In this instance, N has the value of 10. Prior to executing the first iteration, a logical "1" bit value is written to the particularly addressed bit cell of every SRAM row. This operation is indicated in the first row of FIG. 11. The particular bit cell written to in each row is determined by the fixed column address and remains invariant throughout the testing of the row decoders. Since there are 10 row address bits, the operation of writing a logical "1" into a cell of each row requires $2^{10}$ write cycles, or 1024 cycles. The third column of FIG. 11 indicates the use of 1025 cycles because a clock cycle is used, after the sequence of write operations, to reset the address generation circuit to its initial value.

Figure 10C:
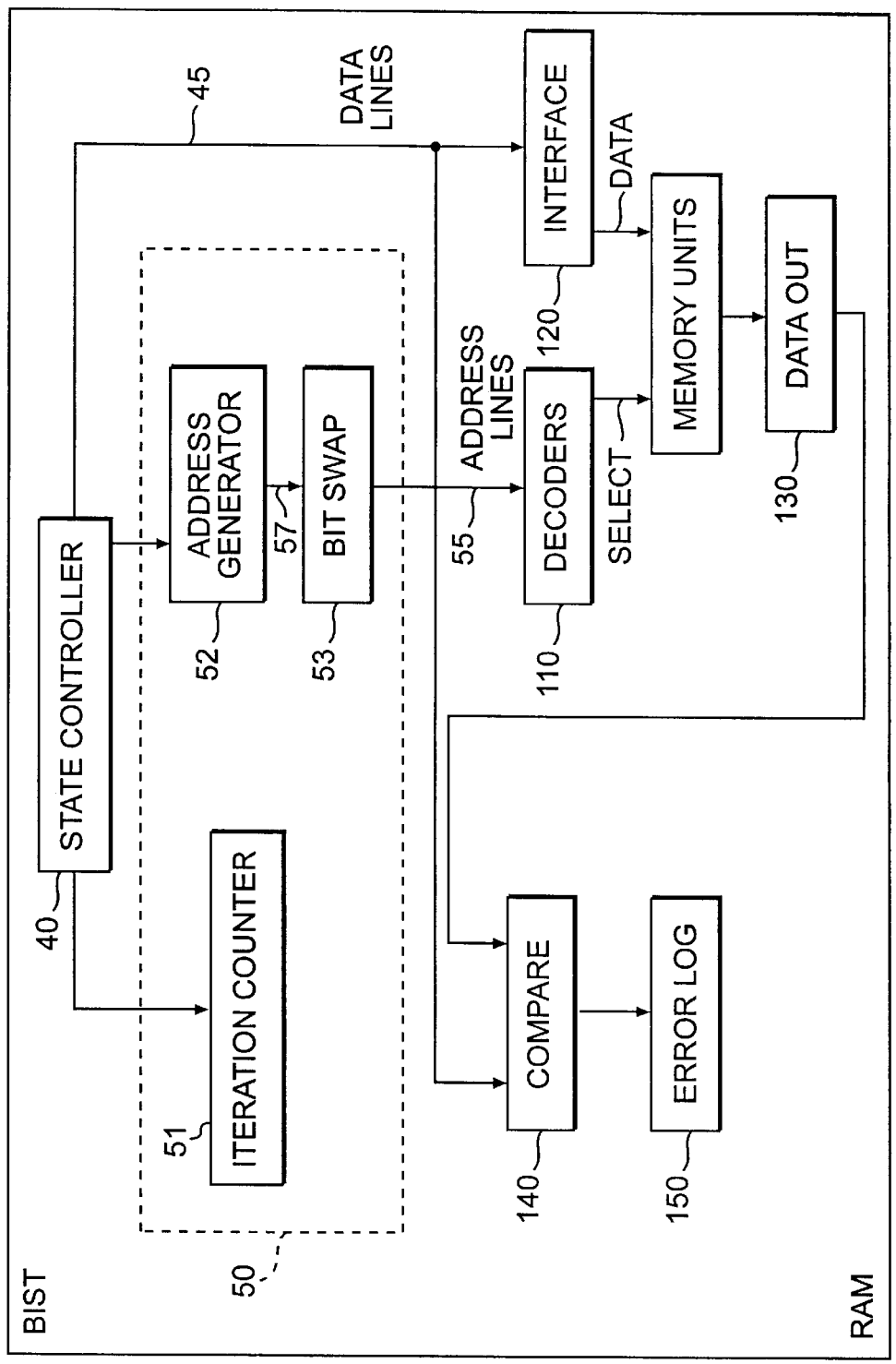
FIG. 10c illustrates a block diagram of the relation between the BIST and its associated RAM.

FIG. 10c illustrates, in block diagram form, an implementation of the BIST of the invention and its association with a RAM. As shown in FIG. 10c addressing module 50 includes an iteration counter 51, an address generator 52 and bit swap 53. A state controller 40 directs operation of the addressing module 50. Also shown in FIG. 10c is the RAM including the rows and columns of memory units 100. An input to the memory units 100 is provided by the decoders 110 and an interface 120. The output of the memory units 100 is provided to a data out element 130. An output of data out 130 is provided to one input of a compare element 140. The output of the compare element 140 is provided to an error log 150. The data input to the memory unit 100 is driven by the output of the interface 120 whose input is in turn driven by an output of the state controller 40 over the data lines 45. The input to the decoders 110 from the bit swap element 53 is on the address lines 55.

The details of the bit swap element 53 comprises the multiplexers connected as shown in FIGS. 10a and 10b. The row and column inputs to the multiplexers 10a and 10b (R–R9 and C0–C4) are represented by the lines 57 connecting the output of the address generator 52 to the bit swap element 53. The address lines 55 which are input to the decoders 110, are represented by lines A0–A14 of FIGS. 10a and 10b.

The second row of FIG. 11 describes the operations performed during the first iteration of the first set of N iterations. A read operation is performed on the addressed bit cell of the first row in the address sequence. Since a logical "1" value was written to this cell in the operation described in the previous row of FIG. 11, the value read from the cell should be a logical "1," also. After the cell value has been read, a logical "0" value is written to the cell. Thereafter, a read operation is performed to determine, again, if the bit value intended to be written to the cell is the same value as the bit read from the cell. This read-write-read operation uses three clock cycles. Any error detected between the bit value intended to be written into the memory cell and that subsequently read from the cell is logged into a device that is capable of storing and indicating the error. When the read-write-read operation is completed for the memory cell of the first addressed row in the sequence, the address generation circuit increments the address value by one so that the read-write-read operation can be performed on the next row in the addressing sequence. This operating sequence continues until each row of the SRAM memory array has had the read-write-read operation performed on its addressed bit cell. Since there are 1024 row addresses in the memory array and each read-write-read operation requires three clock cycles, a total of 3072 clock cycles are used during this iteration. Taking account of the cycle for re-initializing the address generation circuit, a total of 3073 clock cycles are used. Iteration 1 of the first set of N iterations for testing the row decoders is complete, upon executing the above-described operations.

The operation described in the third row of FIG. 11 is performed next. Since this is iteration 2, an even-numbered iteration, the read-write-read sequence will consist of reading a logical "0," writing a logical "1," and reading a logical "1." The address generation circuit will incrementally step through each row address of the memory array, as described for iteration 1, beginning with the lowest value row address. However, during this iteration, the intermediary bit-swapping circuit shown in FIG. 10a will swap the values appearing on input lines R0 and R1 so that the address value provided to the memory array contains the bit value of line R0 on address line A1 and the bit value of line R1 on address line A0. After the read-write-read operation is performed on the addressed bit cell of every row in the memory array, the address generation circuit is re-initialized and iteration 2 of the first set of N iterations is complete. Again, 3073 clock cycles have expired during this iteration.

The operation described in the fourth row of FIG. 11 is performed next. Since this is iteration 3, an odd-numbered iteration, the read-write-read sequence will consist of reading a logical "1," writing a logical "0," and reading a logical "0." The address generation circuit will incrementally step through each row address of the memory array, as described for iteration 2, A beginning with the lowest value row address. During this iteration, the intermediary bit-swapping circuit shown in FIG. 10a will swap the values appearing on input lines R0 and R2 so that the address value provided to the memory array contains the bit value of line R0 on address line A2 and the bit value of line R2 on address line A0. After the read-write-read operation is performed on the addressed bit cell of every row in the memory array, the address generation circuit is re-initialized and iteration 3 of the first set of N iterations is complete. Another 3073 clock cycles have expired during this iteration.

The repetitive process described in the preceding paragraphs is continued until all N iterations of the first set of N iterations have been completed. For each iteration I, the read-write-read operation will consist of reading a logical "0," writing a logical "1," and reading a logical "1," when iteration I is an even-numbered iteration and will consist of reading a logical "1," writing a logical "0," and reading a logical "0," when iteration I is an odd-numbered iteration. Additionally, for each iteration I, the bit values on lines R0 and R(I–1), for I greater than 1, produced by the address generation circuit will be swapped by the intermediary bit-swapping circuit such that the memory array input address line A0 contains the bit value of R(I–1) and address line A(I–1) contains the bit value of R0.

Once all N iterations of the first set of N iterations are complete, the N iterations of the second set of N iterations are performed. However, immediately before executing the second set of N iterations for testing the row decoders, a logical "1" bit value is written to the particularly addressed bit cell of every SRAM row. This operation is indicated in the twelfth row of FIG. 11. The particular bit cell written to in each row is determined by the fixed column address and remains invariant throughout the testing of the row decoders.

After completing the operation of writing a logical "1" value to the particularly addressed bit cell of every memory array row of the SRAM, the second set of N iterations for testing the row decoders is conducted. The sequence of operations performed for this set of N iterations will be the same as that performed for the first set of N iterations, with the exception that the address generation circuit will generate the sequence of addresses in the reverse order of those generated in the first set of N iterations. In other words, the address generation circuit will begin each iteration by generating the highest-valued row address for the memory array and finish each iteration with the lowest-valued row array address. After each read-write-read operation is performed on the addressed bit cell of a memory array row, the address generation circuit will decrement the value of the generated address by one. Upon finishing the second set of N iterations, the testing of the row decoders is complete and the second part of the testing may begin.

The column decoders are tested during the second part of the testing. During this part of the test, the input address to the row decoders is held constant, while the column decoders are cycled through two sets of M iterations. M is the number of column address bits to be decoded. In this example, M has a value of 5. Prior to executing the first iteration for the second part of the testing, a logical "1" bit value is written to the bit cell of every SRAM column within the addressed row. This operation is indicated in the first row of FIG. 12. The particular memory array row written to is determined by the fixed row address and remains invariant throughout the testing of the column decoders. Since there are 5 column address bits, the operation of writing a logical "1" into each column cell of the row requires $2^5$ write cycles, or 32 cycles. The third column of FIG. 12 indicates the use of 33 cycles because a clock cycle is used, after the sequence of write operations, to reset the address generation circuit to its initial value.

The second row of FIG. 12 describes the operations performed during the first iteration of the first set of M iterations, when testing the column decoders. A read operation is performed on the least-significant bit cell of the addressed row. Since a logical "1" value was written to this cell in the operation described in the previous row of FIG. 12, the value read from the cell should be a logical "1," also. After the cell value has been read, a logical "0" value is written to the cell. Thereafter, a read operation is performed to determine, again, if the bit value intended to be written to the cell is the same value as the bit read from the cell. This read-write-read operation uses three clock cycles. Any error detected between the bit value intended to be written into the memory cell and that subsequently read from the cell is logged into the error-logging device. When the read-write-read operation is completed for the least-significant bit cell of the addressed row, the address generation circuit increments the column address value by one so that the read-write-read operation can be performed on the next bit cell in the column addressing sequence. This operating sequence continues until each column address of the SRAM memory array has had the read-write-read operation performed on its bit cell. Since there are 32 discrete column addresses in the memory array and each read-write-read operation requires three clock cycles, a total of 96 clock cycles are used during this iteration. Taking account of the cycle for re-initializing the address generation circuit, a total of 97 clock cycles are used. Iteration 1 of the first set of M iterations for testing the column decoders is complete, upon executing the above-described operations.

The operation described in the third row of FIG. 12 is performed next. Since this is iteration 2, an even-numbered iteration, the read-write-read sequence will consist of reading a logical "0," writing a logical "1," and reading a logical "1." The address generation circuit will incrementally step through each column address of the memory array, as described for iteration 1, beginning with the lowest value column address. However, during this iteration, the intermediary bit-swapping circuit shown in FIG. 10b will swap the values appearing on input lines C0 and C1 so that the address value provided to the memory array contains the bit value of line C0 on address line A11 and the bit value of line C1 on address line A10. After the read-write-read operation is performed on the addressed bit cell of every column in the memory array, the address generation circuit is re-initialized and iteration 2 of the first set of M iterations is complete. Again, 97 clock cycles have expired during this iteration.

The operation described in the fourth row of FIG. 12 is performed next. Since this is iteration 3, an odd-numbered iteration, the read-write-read sequence will consist of reading a logical "1," writing a logical "0," and reading a logical "0." The address generation circuit will incrementally step through each column address of the memory array, as described for iteration 1, beginning with the lowest value column address. During this iteration, the intermediary bit-swapping circuit shown in FIG. 10b will swap the values appearing on input lines C0 and C2 so that the address value provided to the memory array contains the bit value of line C0 on address line A12 and the bit value of line C2 on address line A10. After the read-write-read operation is performed on the addressed bit cell of every column in the memory array, the address generation circuit is re-initialized and iteration 3 of the first set of M iterations is complete. Another 97 clock cycles have expired during this iteration.

The repetitive process described in the preceding paragraphs is continued until all M iterations of the first set of M iterations have been completed. For each iteration I, the read-write-read operation will consist of reading a logical "0," writing a logical "1," and reading a logical "1," when iteration I is an even-numbered iteration and will consist of reading a logical "1," writing a logical "0," and reading a logical "0," when iteration I is an odd-numbered iteration. Additionally, for each iteration I, the bit values on lines CO and C(I−1), for I greater than 1, produced by the address generation circuit will be swapped by the intermediary bitswapping circuit such that the memory array input address line A10 contains the bit value of C(I−1) and address line A(10+(I−1)) contains the bit value of C0.

Once all M iterations of the first set of M iterations are complete, the M iterations of the second set of M iterations are performed. However, immediately before executing the second set of M iterations for testing the column decoders, a logical "1" bit value is written to the bit cell of every SRAM column in the addressed row. This operation is indicated in the seventh row of FIG. 12. The particular row containing the column cells that will be written to is determined by the fixed row address and remains invariant throughout the testing of the column decoders.

After completing the operation of writing a logical "1" value to the addressed bit cell of every column of the memory array row, the second set of M iterations for testing the column decoders is conducted. The sequence of operations performed for this set of M iterations will be the same as that performed for the first set of M iterations, with the exception that the address generation circuit will generate the sequence of addresses in the reverse order of those generated in the first set of M iterations. In other words, the address generation circuit will begin each iteration by generating the highest-valued column address for the memory array and finish each iteration with the lowest-valued column address. After each read-write-read operation is performed on the addressed bit cell of a memory array column, the address generation circuit will decrement the value of the generated address by a value of one. Upon finishing the second set of M iterations, the testing of the column decoders is complete.

In the description provided above, the test pattern has been applied completely to both the row and column decoder circuits of this example. Every FET within the set of row and column decoders, of this example, was tested to determine if it is fully functional. If the error-logging device logged no errors, during this example, then none of the FETs in the decoder circuits have "stuck-open" faults.

Other variations of the test pattern described herein may also be used. For example, it is not necessary for the address generation logic to begin with the lowest value address for the first set of iterations or begin with the highest value address for the second set of iterations. The first address of an iteration can fall anywhere within the range of addresses as long as each address within the range is eventually accessed by the read-write-read sequence. Nor is it necessary that the sequence of incrementing addresses be conducted prior to the sequence of decrementing addresses; the order of the two sequences can be interchanged. It is not necessary for the apparatus that performs the test pattern to be integrated on the same device as the decoder circuits or SRAM. The apparatus may be a separate device capable of interfacing with the relevant SRAM circuits.

We claim:

1. A method of testing a RAM comprising a plurality of uniquely addressable memory units arranged in rows and columns, which are addressed via static decoders, to determine whether any of the static decoders are faulty by performing a series of iterations of logic operations having deterministic results on said memory units of said RAM, said method including:

initiating a count I (in the range 1 to K, where K is an integer greater than 1) to indicate which iteration of the series is being conducted;

generating each of a sequence of multi bit addresses, each multi bit address for application to address lines of the RAM to identify one of the memory units of the RAM, placing the multi bit address on the address lines for a count I equal to 1, and selectively placing the multi bit address on the address lines for count of 2 so as to interchange address bit values for zero and first order address bits; and repeating the selectively placing for each other count I, greater than 2 so that the zero order and (I−1) order bits are interchanged.

2. The method of claim 1 where one series of iterations tests static decoders dedicated to the rows of said RAM and a different series of iterations tests static decoders dedicated to the columns of said RAM.

3. The method of claim 2 wherein in the one series of iterations, K is equal to the number of address bits dedicated to addressing rows and in the different series of iterations K is equal to the number of address bits dedicated to addressing columns.

4. The method of claim 3 wherein the sequence of addresses progress from low to high.

5. The method of claim 3 wherein the sequence of addresses progress from high to low.

6. The method of claim 3 wherein the sequence of addresses first progresses from low to high and later progresses from high to low.

7. The method of claim 1 in which said logic operations further include:

a read operation for each address, and subsequent to each read operation a comparison of the data read and data expected to be read.

8. The method according to claim 7 wherein:

said logic operations comprises a sequence of read, write, and read operations on said addressed memory unit.

9. The method according to claim 8 wherein:

said logic operations comprise a read, write, and read sequence of "true/complement/complement" data, when iteration I is an odd numbered iteration, and said logic operations consist of a read, write, and read sequence of "complement/true/true" data, when iteration 1 is an even numbered iteration, wherein a "true" value may take the form of either a logical "1" or a logical "0" and the "complement" to the "true" value will be the opposite logical value.

10. A test device for a RAM having a plurality of uniquely addressable memory units arranged in rows and columns, which are addressed via static decoders, to determine whether any of the static decoders are faulty by performing a series of iterations of logic operations having deterministic results on said memory units of said RAM, said test device including:

an iteration counter producing a count I identifying an iteration in progress, an address generator for generating each of a sequence of multi bit addresses, each multi bit address for application to address lines of the RAM to identify one of the memory units of the RAM, a bit swapping multiplexer responsive to the address generator and the iteration counter for placing a multi bit address on the address lines for a count I equal to 1, and selectively placing the multi bit address on the address lines for count of 2 so as to interchange address bit values for zero and first order address bits; and for repeating the selectively placing for each other count I, greater than 2 so that the zero order and (I−1) order bits are interchanged.

11. A RAM including a plurality of uniquely addressable memory units arranged in rows and columns and static decoders which address the memory units of the RAM and further including a built in test device comprising the test device of claim 10.

12. The device of claim 11 which further includes:

a comparator circuit for comparing a actual result of said logic operation with an expected result; and, an error indicator responsive to the comparator for indicating the occurrence of a fault when the actual result of said logic operations does not match the desired result.

13. The device of claim 10 wherein the address generator produces a sequence of addresses which proceeds from a low address to a high address.

14. The device of claim 10 wherein the address generator produces a sequence of addresses which proceeds from a high address to a low address.

15. The device of claim 10 wherein at one time the address generator produces a sequence of addresses which proceeds from a low address to a high address and at another time the address generator produces a sequence of addresses which proceeds from a high address to a low address.

* * * * *